United States Patent
Vossough et al.

(10) Patent No.: US 10,386,173 B2
(45) Date of Patent: Aug. 20, 2019

(54) INTEGRATED SENSORY SYSTEMS

(71) Applicants: Kris Vossough, Palo Alto, CA (US); Farhang Yazdani, San Jose, CA (US)

(72) Inventors: Kris Vossough, Palo Alto, CA (US); Farhang Yazdani, San Jose, CA (US)

( * ) Notice: Subject to any disclaimer, the term of this patent is extended or adjusted under 35 U.S.C. 154(b) by 0 days.

(21) Appl. No.: 15/355,068

(22) Filed: Nov. 18, 2016

(65) Prior Publication Data
US 2017/0328702 A1 Nov. 16, 2017

Related U.S. Application Data

(63) Continuation-in-part of application No. 15/269,982, filed on Sep. 20, 2016, now Pat. No. 10,144,635.

(60) Provisional application No. 62/257,234, filed on Nov. 19, 2015.

(51) Int. Cl.

| | |
|---|---|
| *G01B 9/02* | (2006.01) |
| *G01D 21/02* | (2006.01) |
| *G01D 5/353* | (2006.01) |
| *G01L 11/02* | (2006.01) |
| *G01P 15/08* | (2006.01) |
| *G01P 15/093* | (2006.01) |

(52) U.S. Cl.
CPC ..... *G01B 9/02051* (2013.01); *G01D 5/35312* (2013.01); *G01D 21/02* (2013.01); *G01L 11/02* (2013.01); *G01P 15/0802* (2013.01); *G01P 15/093* (2013.01); *B81B 2201/0235* (2013.01)

(58) Field of Classification Search
CPC ............... G01B 9/02051; G01J 3/4535; G02B 26/0841; G02B 26/0833; G01H 9/00
See application file for complete search history.

(56) References Cited

U.S. PATENT DOCUMENTS

| | | | |
|---|---|---|---|
| 7,187,453 B2* | 3/2007 | Belleville | G01J 3/02 356/504 |
| 2005/0237538 A1* | 10/2005 | Belleville | G01J 3/02 356/504 |
| 2006/0192976 A1* | 8/2006 | Hall | G01D 5/266 356/505 |
| 2008/0063232 A1* | 3/2008 | Song | H04R 19/005 381/355 |
| 2015/0177625 A1* | 6/2015 | De Boer | B82Y 40/00 355/67 |
| 2018/0086628 A1* | 3/2018 | Vossough | B81B 7/0029 |

* cited by examiner

*Primary Examiner* — Violeta A Prieto
(74) *Attorney, Agent, or Firm* — Aslan Law, P.C.

(57) ABSTRACT

This invention describes the structure and function of an integrated multi-sensing system. Integrated systems described herein may be configured to form a microphone, pressure sensor, gas sensor or accelerometer. The system uses Fabry-Perot Interferometer in conjunction with beam collimator, beam splitter, optical waveguide and a photodetector integrated. It also describes a configurable method for tuning the integrated system to specific resonance frequency using electrostatic actuators.

18 Claims, 5 Drawing Sheets

Exploded View

INTEGRATED SENSORY SYSTEMS

CROSS REFERENCE TO RELATED APPLICATIONS

This application claims the benefit of priority under 35 U.S.C. § 119(e) of U.S. provisional application Ser. No. 62/257,234, entitled "INTEGRATED SENSORY SYSTEMS", filed Nov. 19, 2015 the content of which is incorporated herein by reference in its entirety.

The present application claims the benefit of priority to and is a continuation in part of U.S. patent application Ser. No. 15/269,982 entitled "INTEGRATED MULTI-SENSING SYSTEMS", filed Sep. 20, 2016, the content of which is incorporated herein by reference in its entirety.

FIELD OF THE INVENTION

The subject matter herein relates to MEMS, and packaging of the semiconductor MEMS devices.

BACKGROUND OF THE INVENTION

Micro-Electro-Mechanical-Systems (MEMS) sensors are becoming increasingly popular as more sensors are being integrated in a variety of systems ranging from consumer electronics to automobile, aerospace, structural monitoring and life science applications. Although, the majority of the MEMS devices are still in the research and development phase, there is also the mature end of the industry that has been producing large volumes of pressure sensors, microphones, inertial motion sensors and gas sensors. The market for the mature MEMS devices has also been experiencing rapid growth as more applications are being developed with new and innovative packaging designs. Furthermore, new MEMS designs are constantly improving the device performance and integrate more functionality within the same chip, or package with smaller form factor. This has been an enabling factor for MEMS researchers to identify fundamental sensing mechanism and implement them, along with required circuitry, onto silicon chips.

New advances in the field of MEMS have broadened considerably the applications of these devices. MEMS technology has also enabled the miniaturization of the devices; a typical MEMS sensor is at least one order of magnitude smaller compared to a conventional sensor that is used to measure the same parameter. Consequently, MEMS devices can be batch-fabricated, this offers a high potential for unit cost reduction. Moreover, proper design can solve some problems related to power consumption, while providing improved performance characteristics, such as accuracy, sensitivity and resolution.

The current and the traditional MEMS sensor products consist of a sensing mechanical structure, i.e. a cantilever, or a membrane, that deflects upon sensing an external force, i.e. pressure, acoustic waves, or accelerations. The mechanical movement, such as deflection, is then converted into an electric signal through the use of piezo-resistive/electric material, or through changing capacitance between the moving part and a reference plate. There are also various geometries used to enhance the sensitivity and displacement range of these designs that would translate into better sensitivity and dynamic range of the overall sensor.

Optical detection systems based on Fabry-Perot interferometry (FPI) allows for highly sensitive sensors that can potentially detect displacement on sub-nanometer scale. This type of sensor consists of two partially transparent parallel plates with reflective inner surfaces, forming a cavity with an optical resonance that depends on the distance between the plates. At resonant wavelengths, the incident light energy is transmitted through the FPI which forms transmission intensity peaks at the resonant wavelengths. In addition to many applications in optical communications, a wide range of sensors can be based on FPI-principals. This invention discloses a FPI with an actuated mirror that is used as the sensing element of microphones, pressure sensors, gas sensors and accelerometers.

A number of suspended Fabry-Perot optical cavity devices have been developed in the past using microfabrication techniques for various applications. Many have been based on integrated bulk micromachining processes due to the stable substrate available for optical deposition. Common to all these devices is that, none were able to achieve a high optical resolution due to mechanical defects or lack of a high quality optical surface on one or both surfaces of the cavity. As of date, no device has been suitable for simple optical serialization for the construction of a distributable array.

However, recent advancements in MEMS fabrication technology and innovations in new designs has overcome the limitations encountered previously in using Fabry-Perot structures for health monitoring sensor arrays: (1) simplified structure, implemented with MEMS technology, enables the fabrication of high finesse Fabry-Perot sensors that have one order of magnitude higher optical sensitivity than previous designs; and (2) A spectrally selective mirror design that enables multiple Fabry-Perot acceleration sensors to be serially concatenated in a simple way. Fabry-Perot (FP) filter for gas analysis in the Mid-Wave Infrared (MWIR) have been fabricated using a new approach that is based on a bulk micro machined Fabry-Perot interferometer with an air cavity, which is electrostatically tuned. Various types of moveable reflectors and spring configurations have been fabricated to determine the optimum solution with respect to maximum tuning range, low gravity influence on center wavelength and suitable filter bandwidth. The main challenge is to achieve a high finesse in spite of non-perfect parallelism, mirror curvature and the additional phase shift caused by the Bragg reflectors. Other approaches to minimizes mirror curvature (hence, higher finesse) by using relatively thick (300 um Silicon) mirror carriers for the coplanar fixed and movable mirrors of the FPI have been reported.

The mirror curvatures can be further minimized by introducing multiple mirror stacks that allows the middle two mirrors to be finely tuned. In four mirror MEMS based FPI, the tuning is achieved either by moving one or both middle mirrors. Performance of the FPI is better in terms of spectral range and percentage transmission, when the tuning is achieved by deflecting both middle mirrors in comparison to the performance when single mirror is used for the tuning of the FPI. The spectral range achieved is 2400-4018 nm when tuned with both the middle mirrors and the sensitivity of the FPI is 5.3 nm for every nm deflection in either of the two middle mirrors. FWHM is below 20 nm for most of the tuned positions.

BRIEF SUMMARY OF THE INVENTION

This invention describes the structure and function of an integrated multi-sensing systems. Integrated systems described herein may be configured to form a microphone, pressure sensor, gas sensor or accelerometer. The system uses Fabry-Perot Interferometer in conjunction with beam collimator lens, beam splitter, optical waveguide and a photodetector integrated. It also describes a configurable method for tuning the integrated system to specific resonance frequency using electrostatic actuators.

DETAILED DESCRIPTION OF THE INVENTION

The various embodiments are described more fully with reference to the accompanying drawings. These example embodiments are provided so that this disclosure will be thorough and complete, and will fully convey the scope of the invention to readers of this specification having knowledge in the technical field. Like numbers refer to like elements throughout.

A new apparatus 100, method of making multi-sensing systems in stacked configuration are disclosed herein. Multi-sensing systems described herein may be configured to form a microphone, pressure sensor, accelerometer or gas sensor.

Figure 1:
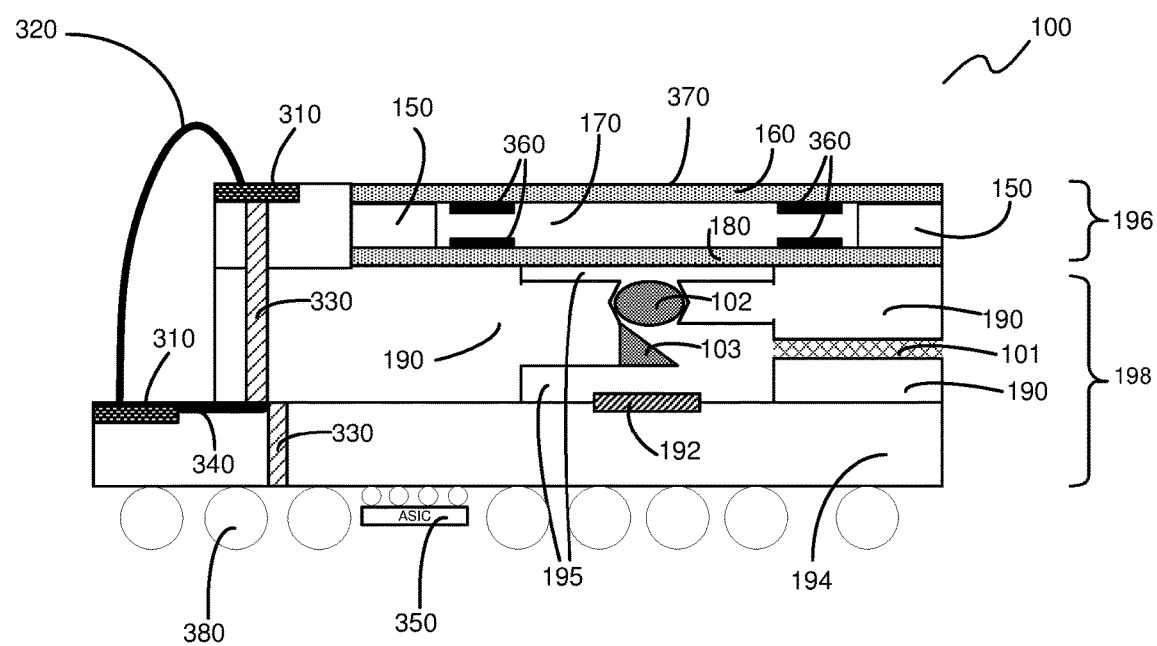
FIG. 1 is a side-view of a multi-sensing integrated MEMS system in accordance with an exemplary embodiment.

FIG. 1 is a side view of a multipurpose multi-sensing systems constructed to sense acoustic signal and act as a sensor such as microphone in accordance with an exemplary embodiment. The multipurpose sensing element of this invention is constructed around Fabry-Perot Interferometer (FPI) 196. In this embodiment, FPI 196 makes use of multiple reflections between a closely spaced partially transmitting mirrors 180, and totally reflective mirror 160 separated by spacers 150.

Figure 4:
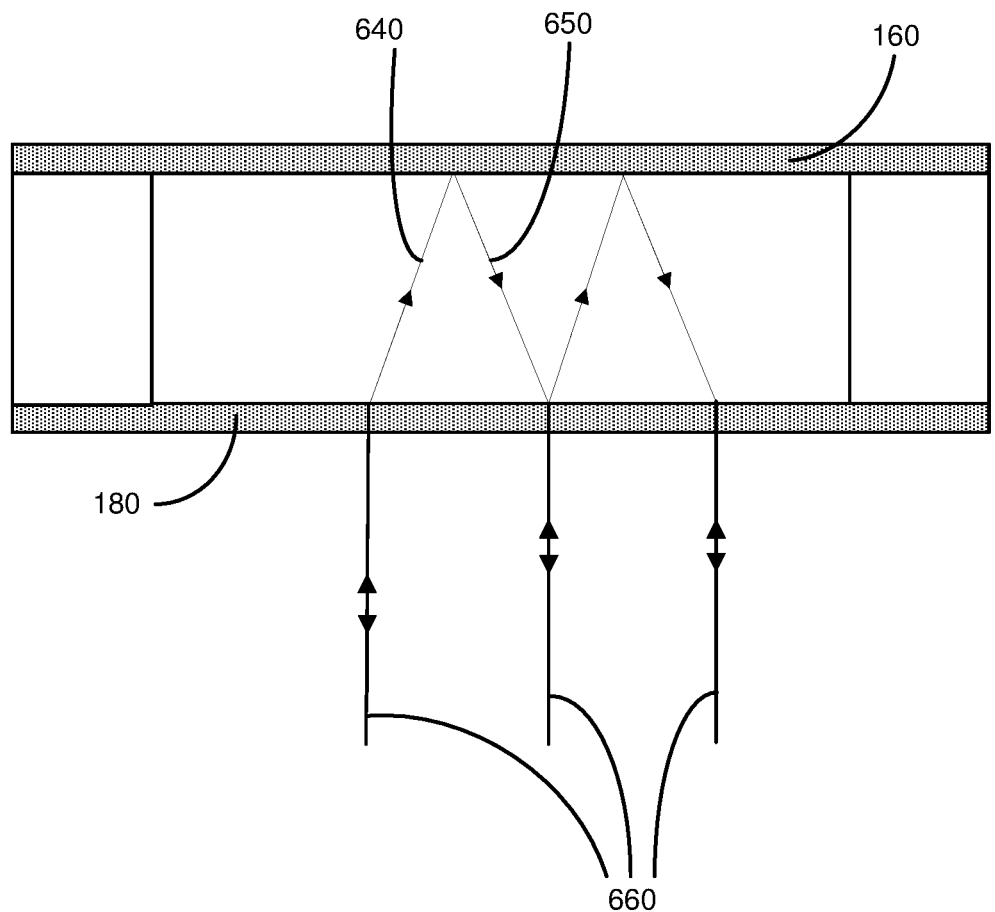
FIG. 4 is a side view of two mirrors used in multi-sensing integrated system, where it shows the light beam reflections in accordance with an exemplary embodiment.

As shown in FIG. 4, part of the light 660 that passes through partially transmitting mirror 180 (beam 640) gets reflected (beam 650) by totally reflective mirror 160. This process continues and some portion of the light is re-transmitted each time the light reaches the lower mirror 180, resulting in multiple offset beams 660 which can interfere with each other. The large number of interfering rays 660 produces an interferometer with extremely high resolution, i.e. sub-nanometer resolution. In a microphone exemplary of this embodiment, the incident light from a monochromatic, or broadband light source is partially transmitted through mirror 180 and is reflected off of mirror 160 which senses the acoustic vibrations. Displacement of the mirror 160 correlated to the incident wave can be measure by either obtaining the shift in the free spectral range at a particular frequency, or measuring the wavelength modulation of the reflected signal. The transmitted optical signal from FPI mirror 180 is then absorbed by the photodetector 192 (FIG. 1), which converts the optical signal to electrical signal. Electrical signal is transmitted through the substrate 194 to the outside world or to an integrated ASIC chip 350 for further processing.

In one embodiment of this disclosure, an optical waveguide (101) is used to deliver light from an outside light source (not shown). The light is partially reflected off of a micro fabricated beam splitter 103. The partially reflected beam is then passes through a micro fabricated collimating lens (102) and then into the Fabry-Perot Interferometer (FPI) 196. Substrate (190) contains at least the micro fabricated collimating lens (102) and the micro fabricated beam splitter (103). Also shown are gap(s) (cavity(ies)) (195).

Figure 5:
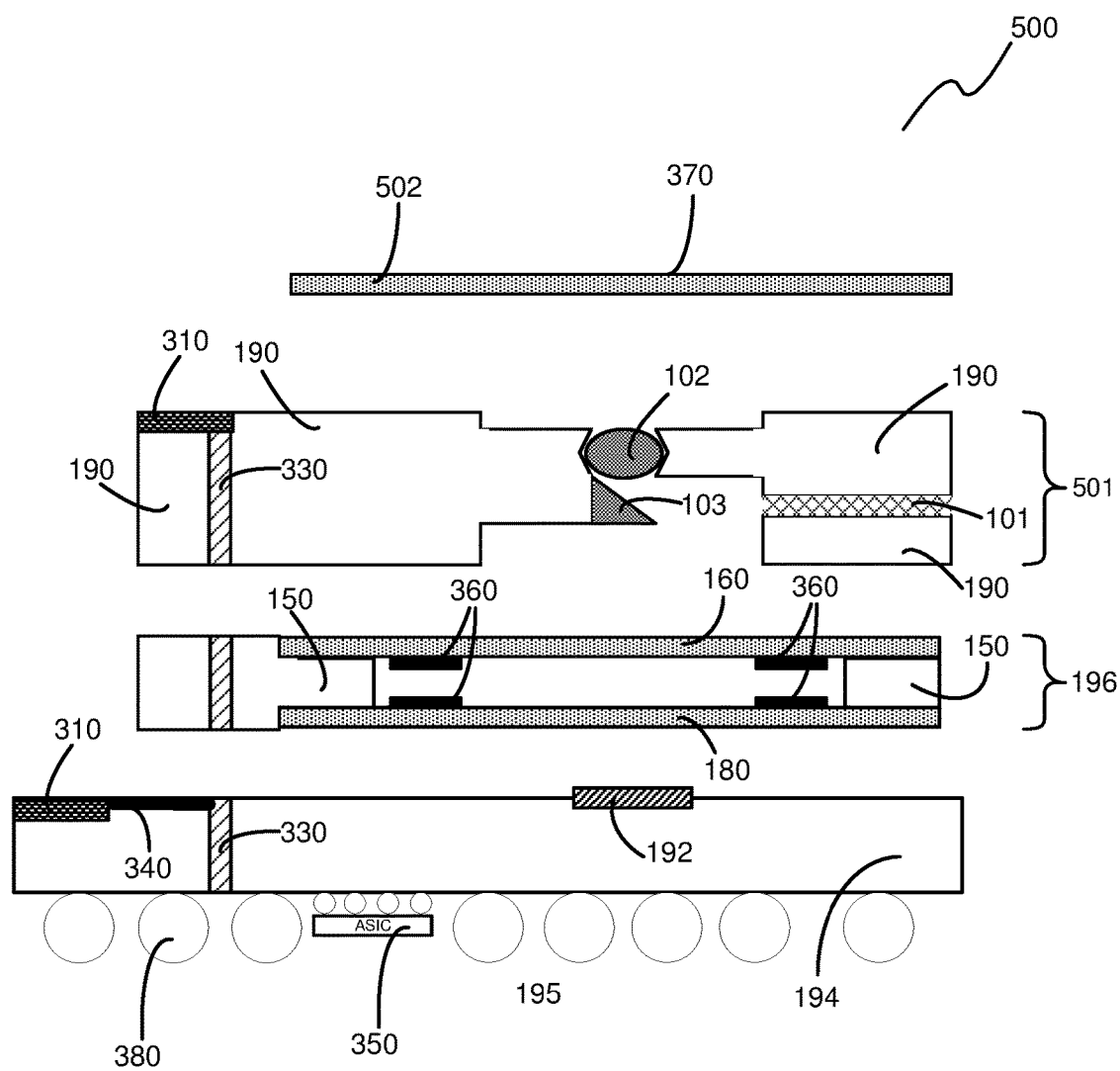
FIG. 5 is a side view of another stacked arrangement of the components of the multi-sensing system in accordance with an exemplary embodiment.

FIG. 1 also shows the 3D construction of a multi-sensing system for concurrent measurement of multiple parameters. In one embodiment of this disclosure 100, structures 196 and 198 are stacked and offset to allow clearance for direct access to one or more pads 310 or one or more conductive elements 310. Combinations of one or more wire bonds 320, with or without redistribution layers (RDL) 340 or vias 330 can be used to communicate among the structures 196 and 198. System 100 may be integrated on a PCB (not shown) using conductive solder balls 380 or wire bonds 320. It is understood that order of stacking of structures 196 and 198 can vary and that any combination of solder balls, direct pad-to-pad or wire bonds (just to name a few) can be used to connect and assemble the structures 196, 198 and a host carrier (not shown). Structure 100 can be bonded/assembled on an ASIC chip 350 for various signal processing purposes. To further miniaturize the system 100, one or more ASIC chips 350 may be mounted on the surface or embedded within any of the stacked structures 196, 198. Structures 196 and 198 may be electrically/mechanically coupled to each other. For example, FIG. 5 shows a different order of stacking of the multi-sensing system 500 components. In this embodiment, mirror membrane 502 with fully reflective surface 370 is situated above the light delivery structure 501, followed by Fabry-Perot Interferometer (FPI) 196 consisting of two partially reflective mirrors 160, 180, followed by photo-detector 192.

In the combined microphone gas sensor exemplary of this embodiment, an adjustable mirror gap is required in order to produce the emission spectra of the target gas. This requires the placement of electrostatic actuators 360 between the Fabry-Perot mirrors 180, 160 in order to control the spacing gap between the mirrors for spectral tuning as depicted in FIG. 1. In combined microphone gas sensor configuration, the structure of the coupled components 196, 198 will remain the same as microphone, except for the addition of conducting electrostatic actuators in between the mirrors. Also, in order to maintain parallelism between the two mirrors during actuation, variable geometries that include tethered mirror may be employed during the fabrication.

In another embodiment of this invention, upon absorption of particular gas on the top mirror surface 370 gas sensing may be realized be measuring the natural frequency of the mirror 160. The change in the natural frequency can then be measured through the same process as explained earlier. It is understood that structure 100 can be constructed in numerous shapes and sizes to optimize the position of the waveguide 101 while enhancing the FPI 196 exposure to the environment.

The advantage of multi-sensing system 100 is that it allows high precision optical deflection measurement, i.e. sub-nanometer deflection detection. It provides combined optical interferometric and emission spectra sensing capability as well as combined microphone and gas sensing capability. It provides tuning capability based on sound pressure level (SPL). In addition, it provides microphone with high sensitivity and wide frequency response with low noise floor better than 15 dB. More importantly, the system 100 has reduced power consumption, by using modulated light with low duty cycle.

In another embodiment of this invention a configurable FPI 196 structure is disclosed. An electrostatic actuation pad 360 may be placed inside the FPI 196 cavity 170 on both opposing sides of the mirrors 160, 180 facing each other. The actuation pads can be used to adjust the gap 170 for specific wavelength and can be used as a band pass filter. Band pass filter enables tuning in/out specific wavelengths.

Figure 2:
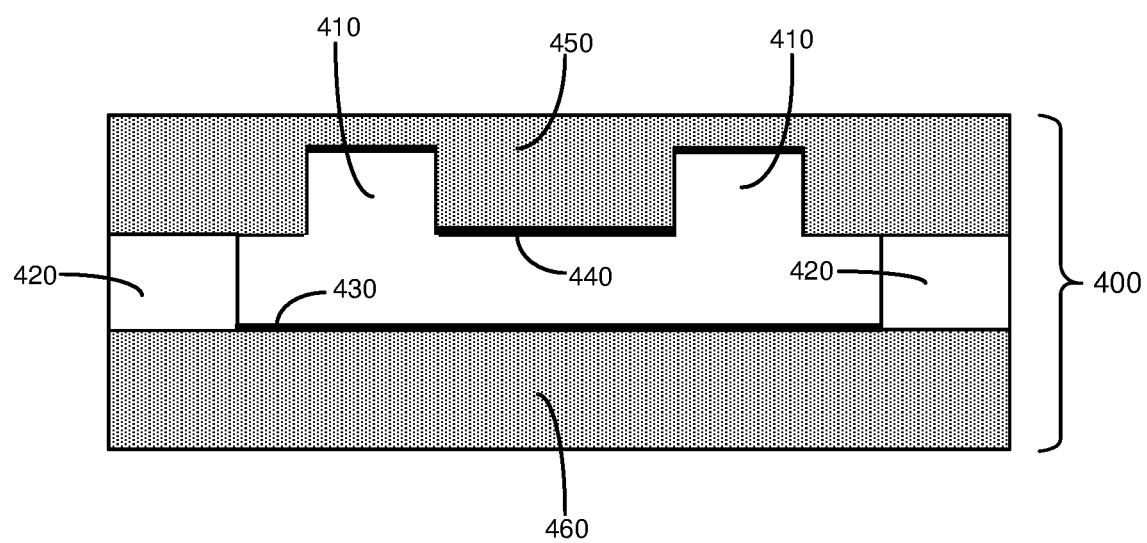
FIG. 2 is a side-view of thick upper and lower mirrors with trenches in accordance with an exemplary embodiment.

In another embodiment of this invention as depicted in FIG. 2, FPI structure 400 is constructed using thick mirrors 450, 460 to maximize the mirrors finesse. The mirror finesse value has a direct effect on the sensitivity of the sensor. Similar to the thin mirrors 160, 180 used in FPI 196 in FIG. 1, the thick mirror FPI 400 may consist of two free mirrors 450, 460 to comprise a microphone only device. Or, one of the mirrors may be electrostatically actuated to enable the interferometer to measure the emission spectra of a target gas. In this embodiment, trenches 410 are etched on the thick mirror 450 to ensure flexibility of the top mirror 440 for acoustic sensitivity and electrostatic actuation. The bottom mirror 460 could be the same thickness or different thickness as the top mirror 450. Spacers 420 can be of variable thicknesses to vary the distance between the top mirror 440 and bottom mirror 430. To create an electrostatic actuator, the mirrors 430, 440 can also act as electrodes to vary the separation of the mirrors 430, 440. It is noted that trenches 410 can be any shape or size.

Figure 3:
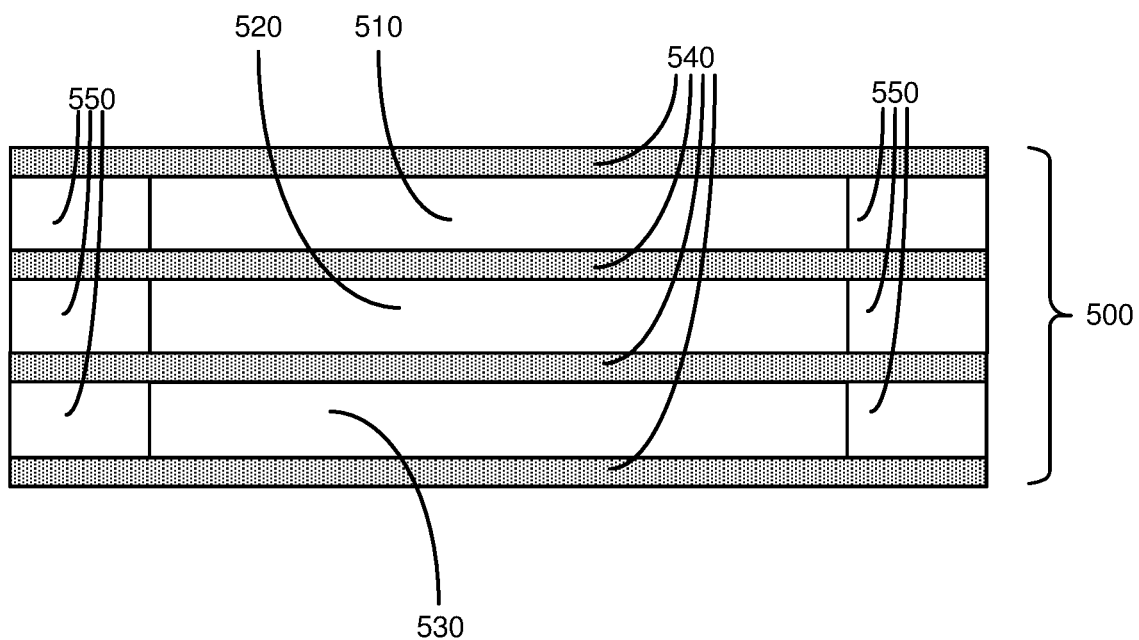
FIG. 3 is a side-view of multi-mirror assembly in accordance with an exemplary embodiment.

In another embodiment of this invention as depicted in FIG. 3, multiple mirrors 540 are stacked 500 to mitigate factors such as finesse, fabrication defects and parallelism that effects FPI performance. The separation between the mirrors 540 is determined by spacers 550. Multi-mirror FPI configuration 500, increases the sensitivity and resolution of the system. Another advantage of the multi-mirror FPI 500 is that it allows frequency ranges between two adjacent transmitted peaks and the Full Width Half Maximum (FWHM) of an FPI to be independently controlled. The cavity gaps 510, 520, 530 determines the Free Spectral Range (FSR). The mirrors reflectivity controls the Full Width Half Maximum (FWHM). The transmission peaks can be made sharper by increasing the reflectivity of the mirror surfaces in multi-mirror FPI. FPI mirror finesse is determined by the ratio of the spectral width over FWHM of the peaks, thus, the narrower FWHM peaks results in higher finesse of the overall FPI. Multi-mirror FPI 500 provides higher resolution and broader spectral range. As a result, multi-mirror FPI provides wider Sound Pressure Level (SPL) in microphone applications and wider emission spectrum for gas detection applications. In addition, multi-mirror FPI has lower optical transmission loss which results in lower power consumption.

In another embodiment of this invention, multiple sensors described in this invention, may be stacked and integrated in to one integrated system. Each individual sensor may be rotated in any axis and be placed anywhere in the stack. An example is to stack Three integrated sensors to enable X, Y and Z direction accelerometers. It is understood that structure 400 (FIG. 2) can be oriented/positioned in any spatial directions to be used as a multi-axis accelerometer. Additionally, each individual sensor may measure different parameter. For example, an integrated system may comprise of 3 sensors, one to measure CO2, another one to measures CO and yet another one to measures the movements in any dimension. Each of the integrated sensors in the stack may have its own characteristics, dimensions, shape and material. For example, in one integrated system, one of the sensors in the stack may have 2 parallel mirrors, while another sensor may have 4 parallel mirrors. Each of the sensors may have their own optical waveguide 101, which may be different from each other, or they may share the same optical waveguide 101. Similarly, each of the sensors may have their own photodetector 192, which may be different from each other, or they may share the same photodetector 192.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A system, comprising:
   a beam collimator;
   a beam splitter;
   an optical waveguide;
   an interferometer;
   a photodetector; and
   a substrate,
   wherein said substrate encompasses and includes at least the beam collimator, the beam splitter and the optical waveguide;
   wherein said interferometer comprising of a semi-transparent mirror and a fully reflective mirror;
   wherein said beam collimator, said beam splitter, said optical waveguide, said interferometer and said photodetector are coupled in a three dimensional stack configuration;
   wherein said beam collimator, said beam splitter, said optical waveguide, said interferometer and said photodetector are separated from each other using spacers;
   wherein said interferometer is above said beam collimator;
   wherein said beam collimator is above said beam splitter;
   wherein said beam splitter is above said photodetector;

wherein light is transmitted through said optical waveguide;
wherein said light hits said beam splitter;
wherein said beam splitter reflects said light towards said beam collimator;
wherein said light passes through said beam collimator and is focused on said interferometer;
wherein said light passes through said semi-transparent mirror of said interferometer;
wherein said light is reflected by said fully reflective mirror of said interferometer;
wherein said light is reflected back and forth between said semi-transparent mirror and said fully reflective mirror;
wherein said reflected light passes through said semi-transparent mirror followed by said beam collimator followed by said beam splitter
and is detected by said photodetector;
wherein said system dynamically measures the displacement between said semi-transparent mirror and said fully reflective mirror; and
wherein semi-transparent mirror is stacked above and on said substrate.

2. A system as in claim 1, wherein any of said mirrors are movable.

3. A system as in claim 1, wherein said system comprises further of a plurality of electrostatic actuators, where said displacement between said mirrors is adjusted by said electrostatic actuators.

4. A system as in claim 3, wherein
the surface of said mirrors can function as electrostatic actuator.

5. A system as in claim 3, wherein said displacement between said mirrors is configured by applying electric voltage to said electrostatic actuators.

6. A system as in claim 1, wherein said mirrors are vibrated via acoustic pressure level.

7. A system as in claim 1, wherein said displacement between said mirrors is changed by air pressure.

8. A system as in claim 1, wherein said mirrors are displaced via movement of said system.

9. A system as in claim 1, wherein said system can measure the natural frequency of said mirrors.

10. A system as in claim 1, wherein a single instance of said system can function as a combination of a pressure sensor, a microphone, an accelerometer, and/or a gas sensor.

11. A system as in claim 1, wherein said photodetector and said interferometer are stacked by some offset to allow clearance for direct attachment to pads or conductive elements.

12. A system as in claim 11, wherein said photodetector, and said electrostatic actuators are electrically coupled using wire bond or vias; with or without redistribution layer.

13. A system as in claim 1, wherein at least one integrated circuit is surface mounted or embedded within said system.

14. A system as in claim 1, wherein said system comprises of two or more of said semi-transparent mirrors and one of said reflective mirror.

15. A system as in claim 1, wherein trenches are etched in said mirrors.

16. A system as in claim 1, wherein said displacement between said mirrors is measured by obtaining the shift in the free spectral range at a particular frequency, or measuring the wavelength modulation of said reflected light.

17. A system as in claim 1, wherein said photodetector converts the optical signal to electrical signal, wherein said electrical signal is transmitted through said system to outside world or to an integrated ASIC chip for further processing.

18. A system as in claim 1, wherein
any of said mirrors are movable,
a single instance of said system can function as a combination of a pressure sensor, a microphone, an accelerometer, and/or a gas sensor,
said displacement between said mirrors is measured by obtaining the shift in the free spectral range at a particular frequency, or measuring the wavelength modulation of said reflected light, and
said photodetector converts the optical signal to electrical signal, wherein said electrical signal is transmitted through said system to outside world or to an integrated ASIC chip for further processing.

* * * * *